331-98

SEARCH ROOM

Sept. 20, 1966 B. F. GREGORY 3,274,513

BROAD BAND TUNABLE MICROWAVE OSCILLATOR WITH SUBSTANTIALLY CONSTANT OUTPUT POWER CHARACTERISTICS

Filed Oct. 30, 1963 6 Sheets-Sheet 1

INVENTOR
Benjamin F. Gregory
BY
Blair + Buckles
ATTORNEYS

INVENTOR
Benjamin F. Gregory
BY
Blair + Buckles
ATTORNEYS

INVENTOR
Benjamin F. Gregory
BY
Blair + Buckles
ATTORNEYS

Sept. 20, 1966 B. F. GREGORY 3,274,513

BROAD BAND TUNABLE MICROWAVE OSCILLATOR WITH SUBSTANTIALLY CONSTANT OUTPUT POWER CHARACTERISTICS

Filed Oct. 30, 1963 6 Sheets-Sheet 4

INVENTOR
Benjamin F. Gregory
BY
Blair + Buckles
ATTORNEYS

INVENTOR
Benjamin F. Gregory
BY
Blair + Buckles
ATTORNEYS

INVENTOR
Benjamin F. Gregory
BY
Blair + Buckles
ATTORNEYS

United States Patent Office 3,274,513
Patented Sept. 20, 1966

3,274,513

BROAD BAND TUNABLE MICROWAVE OSCILLATOR WITH SUBSTANTIALLY CONSTANT OUTPUT POWER CHARACTERISTICS

Benjamin F. Gregory, Tampa, Fla., assignor to Trak Microwave Corporation, Tampa, Fla.

Filed Oct. 30, 1963, Ser. No. 325,833
3 Claims. (Cl. 331—98)

The present invention relates to radio frequency devices having distributed parameter circuits. More specifically, the invention is directed to ultrahigh-frequency devices of transmission line construction which are tunable over a wide frequency range. Specific although not limited application of the invention is in the field of ultrahigh-frequency triode oscillators or sources.

Microwave sources utilizing vacuum tube triodes are known and a discussion of various embodiments thereof may be found in chapter 10 of "The Principles of Radar" by Reintjes and Coate, published in 1952 by McGraw-Hill Company, Inc.

The present invention relates to the design and construction of an improved vacuum tube triode oscillatory source capable of operating over a wide frequency range, as for example, from 2000 megacycles to 4100 megacycles. At such high frequencies and over such a wide frequency range the interference caused by the excitation of spurious propagational modes is an ever present problem. The excitation of spurious modes is objectionable for various reasons. Increased losses result, causing a reduction in the output of device and, at certain frequencies, oscillations may cease entirely. "Holes" are then said to exist in the tuning range. In addition, resonant operation may jump from the desired mode to a spurious propagational mode as the device is loaded or tuned.

Loading of an oscillatory source at elevated frequencies also has an adverse effect on the amplitude and phase of the electrical energy feedback from the output to the input of the vacuum tube triode, frequently causing a cessation of oscillations.

It is therefore an object of the present invention to provide a vacuum tube triode oscillator capable of sustained operation over a wide frequency range at ultrahigh-frequencies.

A further object is to provide a triode oscillatory source capable of producing relatively high power outputs at elevated frequencies. Another object is to maintain the output power approximately constant over the entire frequency band.

An additional object is to provide a triode oscillatory source which is constrained to operate in a single preferred mode while all other propagational modes are effectively suppressed. Another object is to provide an improved frequency tuning drive for maintaining the triode oscillator in the desired operational mode.

A still further object is to provide a wide band triode oscillator having a substantially linear frequency tuning characteristic. A collateral object is to provide a triode oscillator achieving the aforementioned objects and yet being of rugged construction, easily fabricated and readily assembled.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in conjunction with the accompanying drawings, in which.

*General description*

Figure 1:
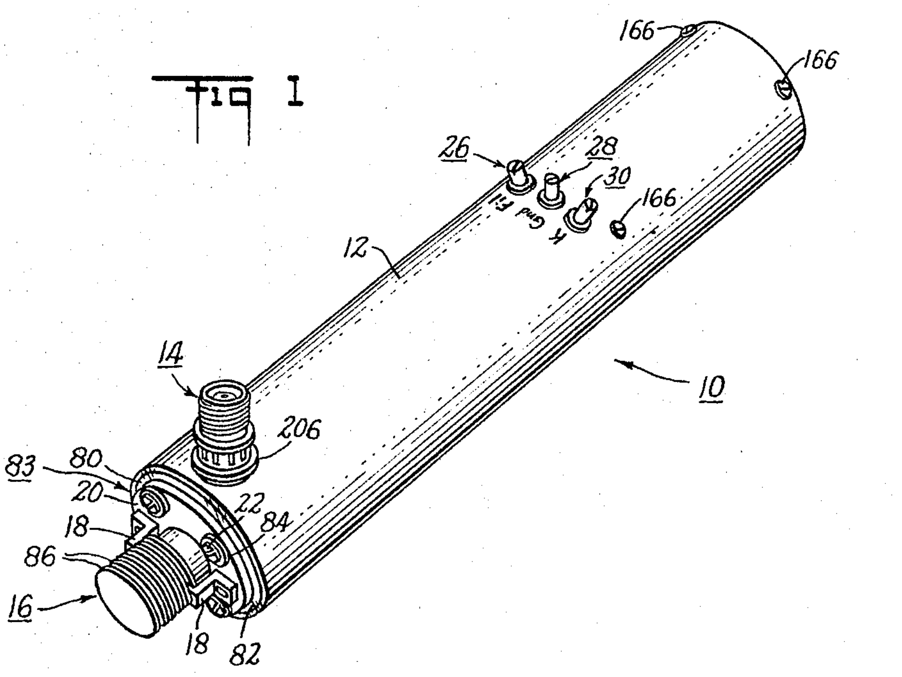
FIGURE 1 is a perspective view of a microwave source embodying the invention.

In general, as seen in FIGURE 1, a source 10 embodying the invention has a conductive, cylindrical outer shell 12 fitted with a coaxial output connector 14 by which the desired radio frequency signal is extracted.

Figure 2:
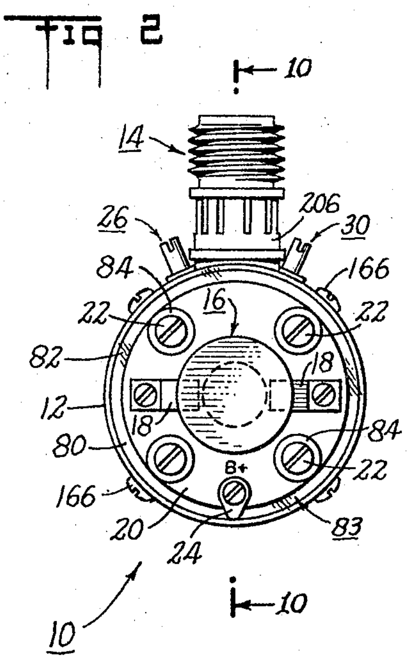
FIGURES 2 and 3 are respective end views of the source shown in FIGURE 1.

As shown in FIGURES 1 and 2, a high frequency triode indicated generally at 16 is partially inserted in one end of the shell 12. A pair of hooked mounting members 18 serve to clamp the triode 16 to a plate terminal member 20 which, in turn, is retained over the end of the shell 12 by a plurality of screws 22. A B+ connection in the form of a terminal screw 24 threadingly engaging the plate terminal member 20 provides for external circuit connection to a plate voltage supply source, not shown. External terminals 26, 28 and 30 provide circuit connection means for the filament, grid and cathode, respectively, of the triode 16.

Figure 3:
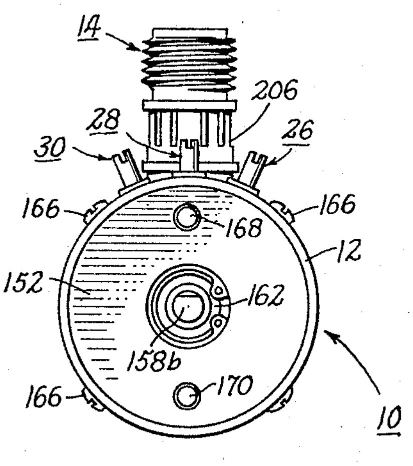

The other end of the shell 12, as seen in FIGURE 3, receives a tuning drive assembly, generally indicated at 32.

Figure 4:
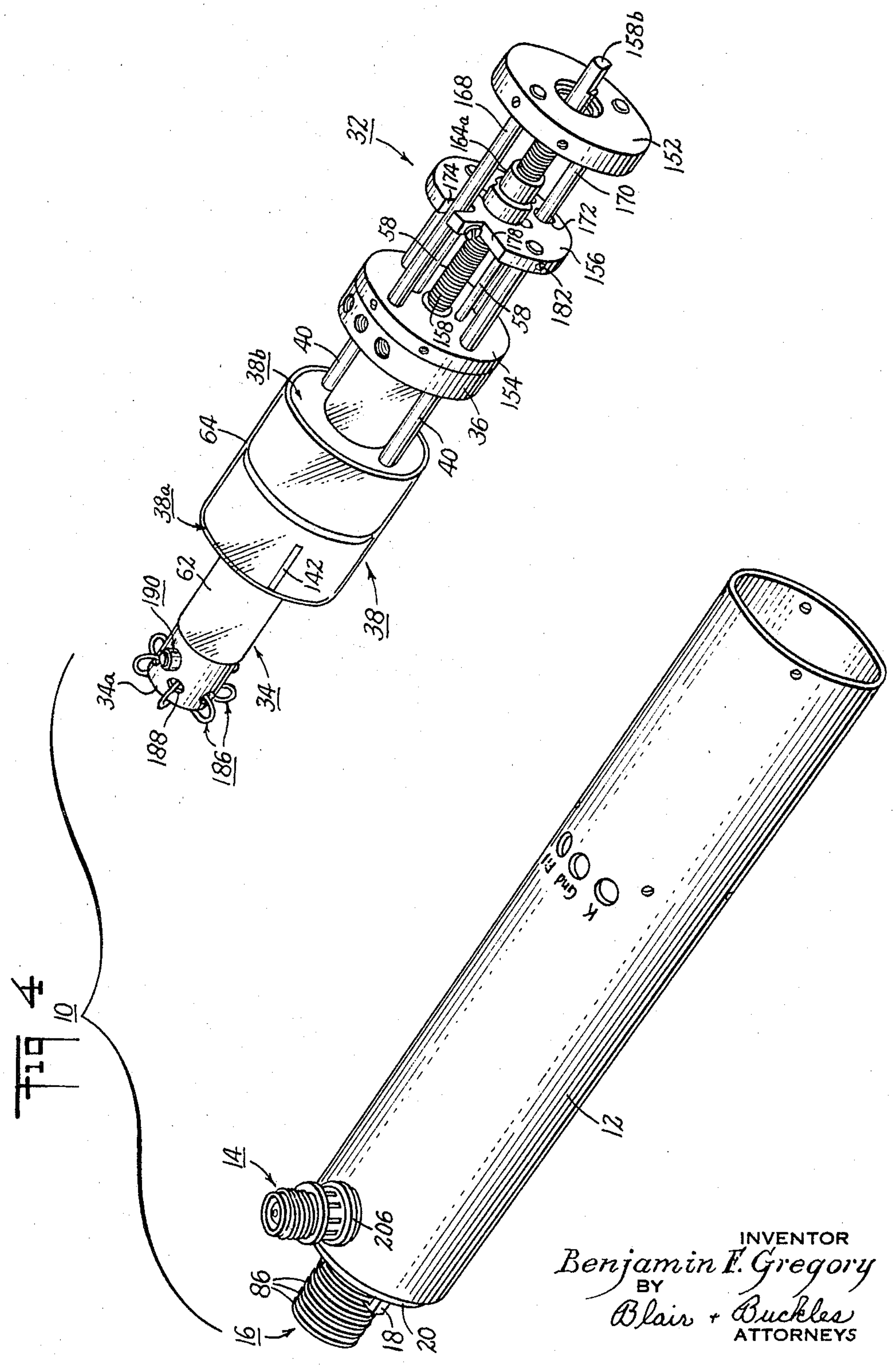
FIGURES 4 through 9 are perspective views of various component parts of the invention to illustrate the manner of assembly thereof.

Turning to FIGURE 4, the interior component parts of the source 10 are shown removed from within the shell 12. Thus, a grid line 34 is mounted at one end in a grid line insulator 36. A plate choke assembly 38 encompasses the grid line 34 and is drivingly connected to the tuning drive assembly 32 by push rods 40. The tuning drive assembly 32 is affixed to the grid line insulator 36 by means of spaced screws, not shown.

FIGURES 5 through 9 show, in perspective, certain individual subassemblies of the source 10. Considering first FIGURE 9, there is shown a filament contact assembly 42 including an elongated rod 44 with a filament contactor 46 mounted at one end thereof.

Figures 5, 6, 7, 8, 9:
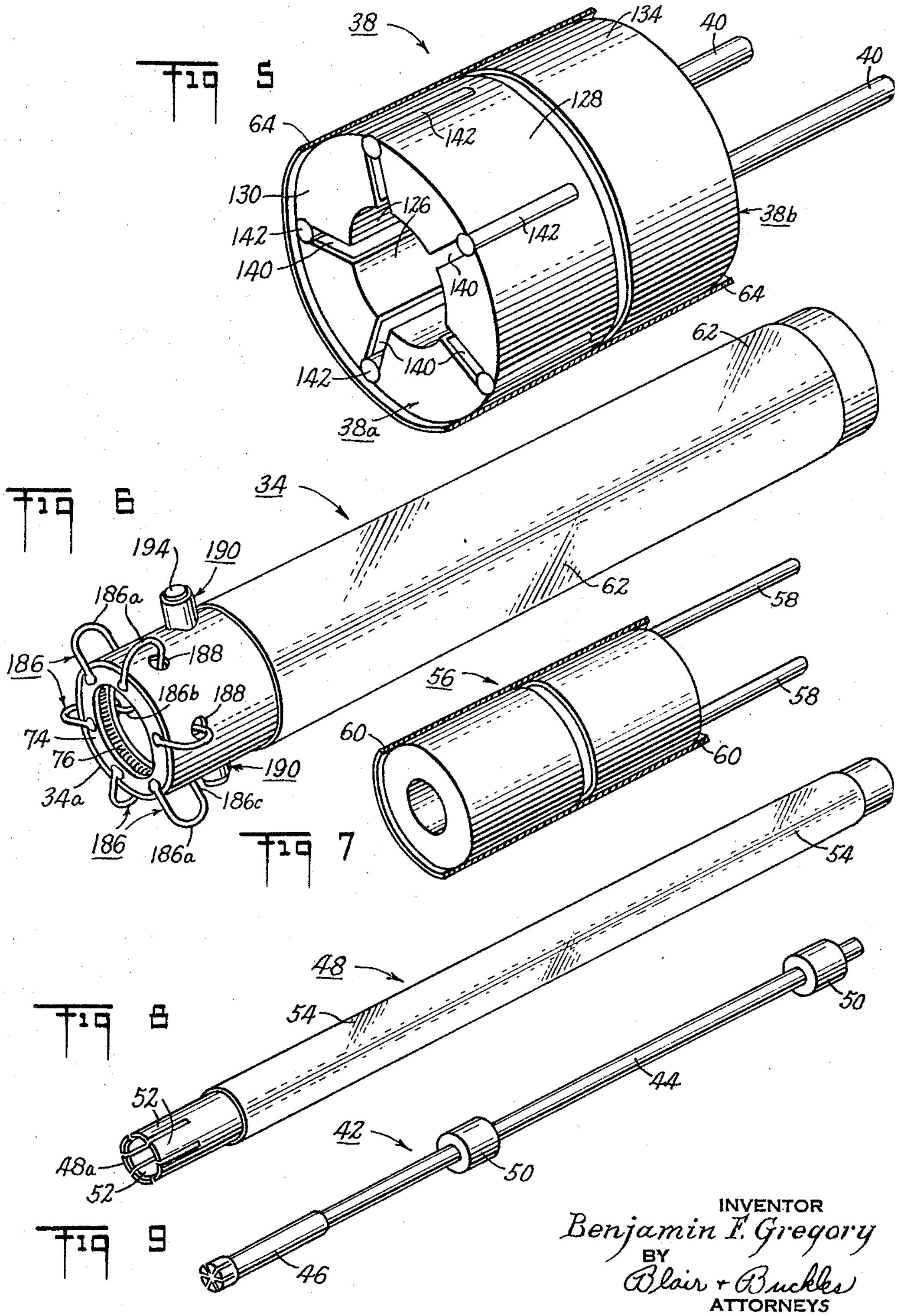

The filament contact assembly 42 is inserted into a cathode line 48, shown in FIGURE 8, and is maintained in coaxial alignment therein by a pair of spacers 50 shown in FIGURE 9. The spacers 50 are formed of an insulating material and thus also serve to electrically insulate the filament contact assembly 42 from the cathode line 48. The end 48*a* of the cathode line 48 is integrally formed with a plurality of resilient fingers 52 to ensure good electrical contact with the cathode of the triode 16, as will be subsequently seen.

The outer surface of the cathode line 48 is covered with an insulating material 54 such as Teflon tape and is inserted through an axial bore provided in a cathode choke assembly 56 shown in FIGURE 7. The cathode choke assembly 56 is adapted to slide axially along the cathode line 48 on actuation of the tuning drive assembly 32, shown in FIGURE 4, in the manner to be described hereinafter. Push rods 58 of FIGURE 7 provide the driving connection between the cathode choke assembly 56 and the tuning drive assembly 32. The outer surface of the cathode choke assembly 56 is covered with a layer 60 of Teflon tape.

The coaxial arrangement of the filament contact assembly 42 (FIGURE 9), the cathode line 48 (FIGURE 8), and the cathode choke assembly 56 (FIGURE 7) is inserted into the grid line 34 (FIGURE 6) which is in the form of an elongated tubular, conductive member. The outer surface of the grid line 34 is also covered with a layer 62 of Teflon tape.

Finally, the plate choke assembly 38 shown in FIGURE 5 slides on to the grid line 34 to complete the assembly of those subassemblies shown in FIGURES 5 through 9. The outer surface of the plate choke assembly 38 is covered with a layer 64 of Teflon tape prior to the insertion of the assemblage of FIGURES 5 through 9 into the shell 12 as illustrated in FIGURE 4.

*Triode*

Figures 10, 11, 12:
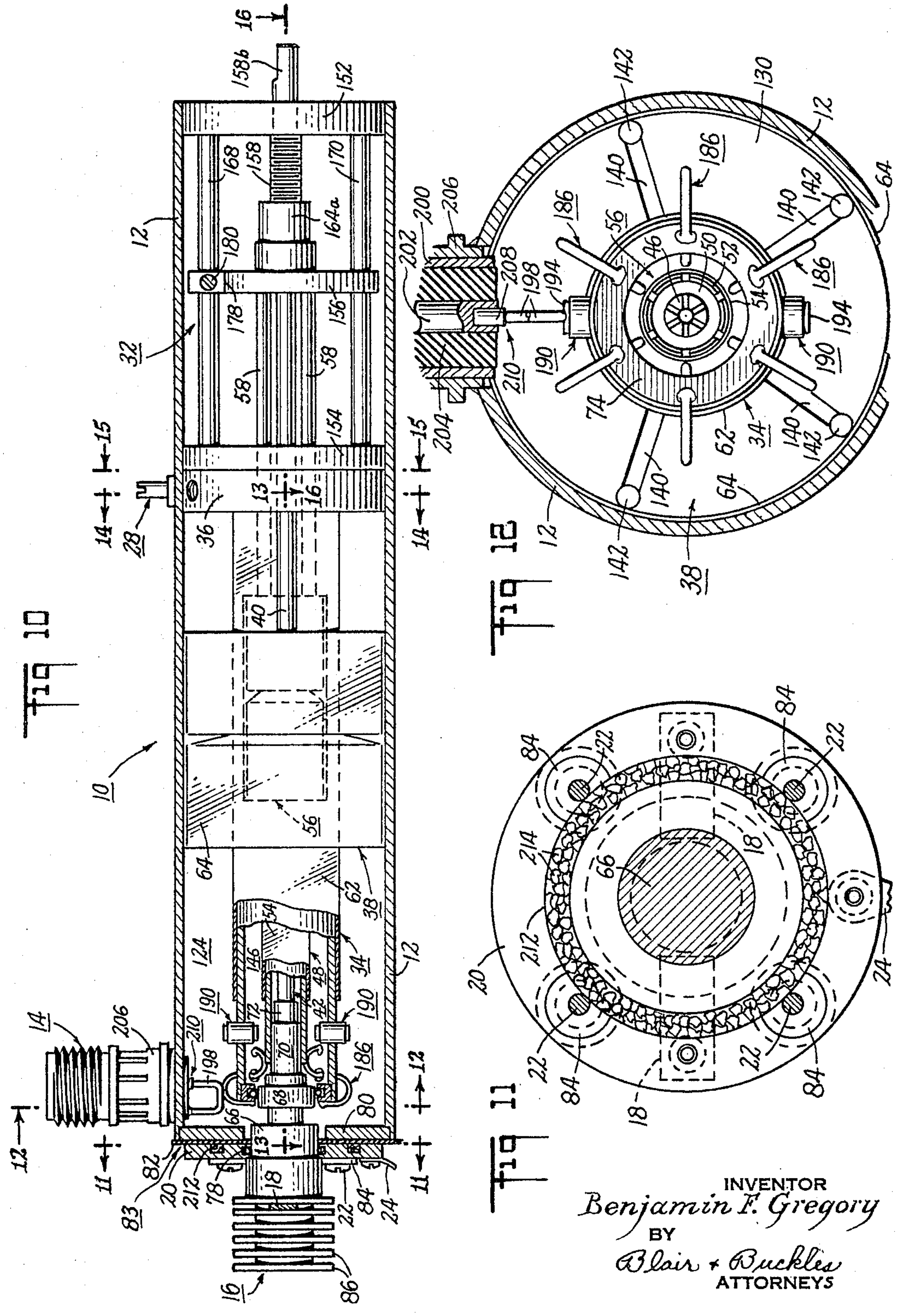
FIGURE 10 is a sectional side elevation view of the source of FIGURE 1 taken along line 10—10 of FIGURE 2.
FIGURE 11 is an enlarged sectional end elevation view of the source of FIGURE 1 taken along line 11—11 of FIGURE 10.
FIGURE 12 is an enlarged sectional end elevation view taken along line 12—12 of FIGURE 10.
Figures 13, 14, 15:
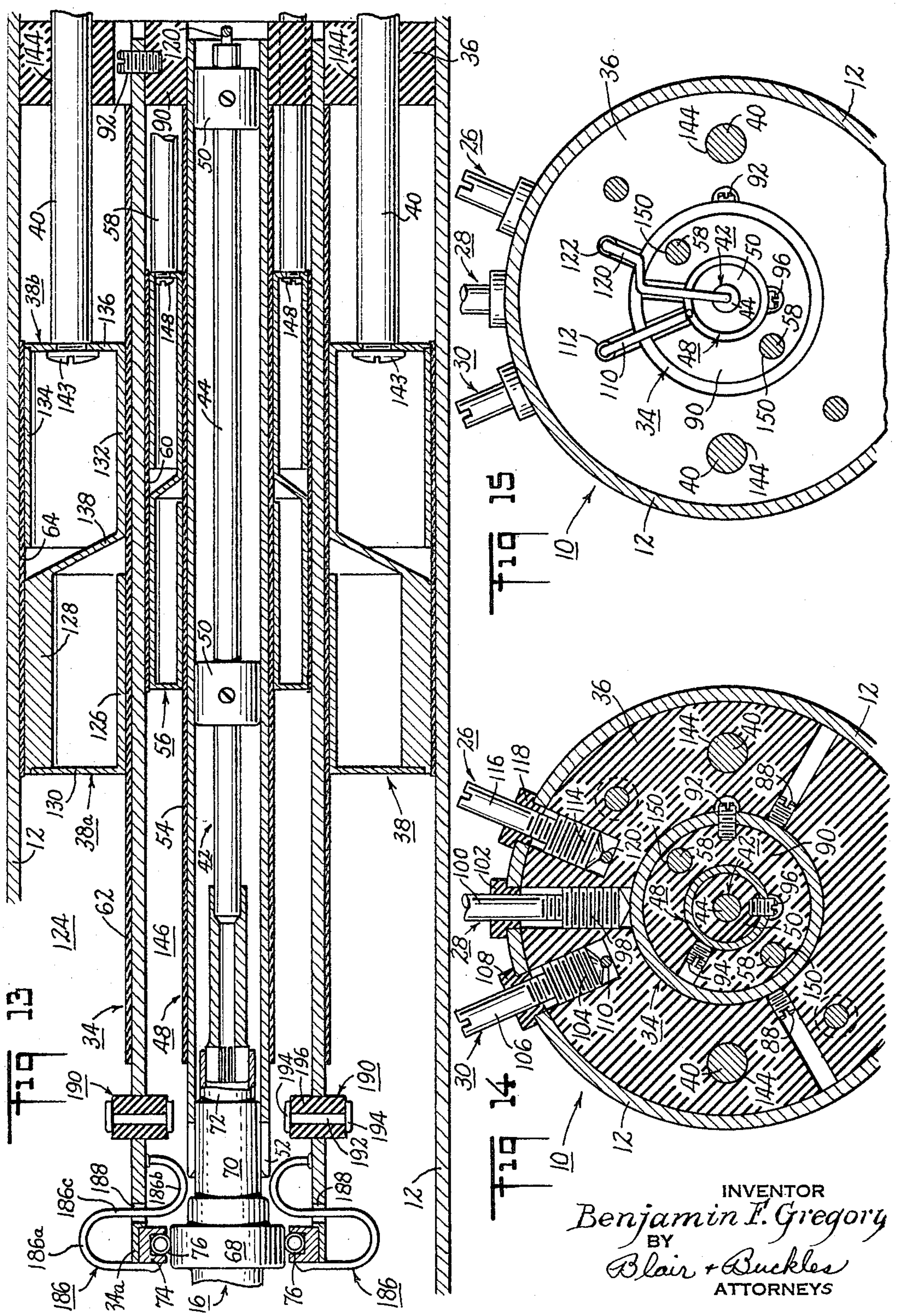
FIGURE 13 is an enlarged sectional top view taken along line 13—13 of FIGURE 10.
FIGURE 14 is an enlarged sectional end elevation view taken along line 14—14 of FIGURE 10.
FIGURE 15 is an enlarged sectional end elevation view taken along line 15—15 of FIGURE 10.

The vacuum tube triode 16, which may be a Siemens RH6C or its equivalent, is seen most clearly in FIGURES 10 and 13. As there shown, the triode 16 includes a plate ring 66, a grid ring 68, a cathode pin 70 and a filament pin 72.

With particular reference to FIGURE 13, the filament contactor 46 of the filament contact assembly 42 is inserted into and makes electrical contact with the interior surface of the filament pin 72. The integrally formed fingers 52 of the cathode line 48, coaxially disposed with relation to the filament contact assembly 42, slide over the cathode pin 70 making electrical contact therewith.

The inner bore at the lefthand end **34*a* of the grid line 34 is recessed to receive a U-shaped annular member 74 and is retained in place by a suitable means such as soldering or dip brazing. A coiled spring 76 is disposed in the annular groove of the U-shaped member 74. Thus, the grid ring 68 of the triode 16, when inserted into the end 34*a* of the grid line 34, flattens the coiled spring 76 thus ensuring optimum electrical contact between the ring 68 and the grid line 34**.

Returning to FIGURE 10, electrical contact between the plate ring 66 of triode 16 and the plate terminal member 20 is effected in substantially the same manner as between the grid ring 68 and the grid line 34. Accordingly, the plate ring 66 projects through a central hole provided in the plate terminal member 20 and electrical contact therebetween is insured by the resulting flattening of a coiled spring 78 disposed in a groove formed in the bore surface of the central hole. The plate terminal member 20 is mounted by screws 22 to an end wall 80 affixed in the open end of shell 12. The plate terminal member 20 is electrically insulated from the end wall 80 and thus shell 12 by a layer 82 of insulating material such as mica which is interposed therebetween. This insulative layer 82 also forms a plate by-pass capacitor 83 for coupling radio frequency energy from the plate ring 66 of triode 16 to the shell 12. The screws 22 are electrically insulated from the plate terminal member 20 by flanged sleeves 84. Finally, the central hole in the end wall 80 through which the plate ring 66 projects is sufficiently larger in diameter than necessary to ensure a non-contacting physical relationship therebetween. The tube 16 is further provided with a heat exchanger 86, seen in FIGURES 1 and 10, to facilitate the rapid dissipation of heat developed by the triode 16.

As previously described, circuit connection to the plate voltage supply, not shown, is made directly to the plate terminal member 20 via terminal screw 24 (FIGURE 2). For a detailed consideration of the external circuit connections to the grid 68, cathode 70 and filament 72 of triode 16, reference is made to FIGURES 14 and 15. As seen in FIGURE 14, the coaxial relationship between the grid line 34 and the shell 12 is maintained by the insulator 36 referred to in the discussion of FIGURE 4 and shown also in FIGURES 10 and 13. A pair of set screws 88 are advanced through threaded radial bores in the insulator 36 into engagement wtih the grid line 34 in order to clamp the insulator 36 to the grid line. A second insulator 90 serves to coaxially align the cathode line 48 and the grid line 34. A screw 92 is advanced through the wall of the grid line 34 and into a threaded bore in the insulator 90 to retail the latter in place. A set screw 94 advanced through a threaded radial hole in the insulator 90 into engagement with the cathode line 48. An additional screw 96 projects through the cathode line 48 and into the rearmost spacer 50 to affix the filament contact assembly 42 with respect to the cathode line 48. It will be noted that by the provision of the aforementioned screws the relative positions of the various parts are maintained and yet these various parts remain electrically isolated from one another.

Still referring to FIGURE 14, the grid external terminal 28 is shown extending through the outer shell 12 and into electrical contacting engagement with the grid line 34. The grid terminal 28 includes a contactor screw 98 which threadedly engages a radial bore in the insulator 36. The pointed end of contactor screw 98 makes electrical contacting engagement with the grid line 34. A shank 100 projects through the outer shell 12 and into threaded engagement with an internal bore provided in contactor screw 98. A flanged sleeve 102 serves to electrically isolate the grid terminal 28 from the shell 12.

As further seen in FIGURE 14, the cathode external terminal 30 includes a contactor screw 104 threadingly engaging a radial bore drilled partially through the insulator 36. A shank 106 projects through the outer shell 12 and into threaded engagement with an internal bore in the contactor screw 104. Electrical isolation between the cathode terminal 30 and the outer shell 12 is provided by a flanged sleeve 108 of insulating material.

An insulated conductor 110, seen more clearly in FIGURE 15, provides circuit connection between the cathode terminal 30 and the cathode line 48. One end of the conductor 110 is contacted by the contactor screw 104 by a solder connection or merely by clamping the insulation free end of the conductor 110 between the end of the contactor screw 104 and the bottom of the bore which accommodates the contactor screw 104. The conductor 110 is then brought out to the outer face of the insulator 36 through an axial hole 112. The conductor 110 then runs in grooves in the face of insulators 36 and 90 and over the end of the grid line 34 to the cathode line 48. A solder connection between the cathode line 48 and the conductor 110 completes the cathode D.C. circuit for the triode 16.

Returning to FIGURE 14, the filament external terminal 26 includes a contactor screw 114 disposed in a threaded radial bore drilled partially through insulator 36. A shank 116 insulated from the outer shell 12 by a flanged sleeve 118 threads into an internal bore provided in contactor 114. As in the situation for the cathode terminal 30, a conductor 120 (FIGURE 15) provides circuit connection between the filament terminal 26 and the filament contact assembly 42. Accordingly, the conductor 120 is brought out to the face of insulator 36 through an axial hole 122 from which it runs through grooves in the face of insulators 36 and 90 and over the ends of the grid line 34 and the cathode line 48 to the filament contact assembly 42. The end of the conductor 120 is soldered to the end of the filament rod 44. Circuit connection at the other end of the conductor 120 to the filament terminal 26 is effected in the same manner as described for the cathode terminal 30 and the conductor 110.

*Tuning choke assemblies 38 and 56*

The plate choke assembly 38, as shown in FIGURES 5 and 13, is of the general type known as a Z choke. Z chokes are readily recognized from their generally Z-shaped cross-section as shown in FIGURE 13. The plate choke 38 is of the noncontacting type due to the provision of the layer 64 of Teflon tape disposed between the plate choke and the outer shell 12 and the Teflon tape layer 62 between the plate choke and the grid line 34. This provision enhance the tuning resolution of the plate choke as compared to chokes of the contacting type. The plate choke 38 in combination with the outer shell 12, end wall 80 (FIGURE 10) and the grid line 34 serve to physically define a resonant plate coaxial line 124.

The plate choke assembly 38, as seen in FIGURE 13, consists of a front section 38*a* including inner and outer diameter wall portions 126 and 128, and a front radial wall 130. The rear section 38*b* of plate choke assembly 38 includes inner and outer diameter wall portions 132 and 134, and a rear radial wall 136. Interconnecting the front and rear choke sections 38*a* and 38*b* is a wall portion 138. In the manufacture of the plate choke assembly 38, the wall portions 128, 138, 132 and 136 may be fabricated as an integral unit. The wall portions 126 and 130 may be integrally formed while portion 134 can be a single unit. These various parts are then joined such as by dip brazing in the manner shown in FIGURE 13 to form the Z-shaped cross-section of the plate choke assembly 38. The outer diameter wall portion 128 of the front section 38*a* is made having a substantially thicker material thickness than the remaining wall portions for reasons to be subsequently discussed.

As better seen in FIGURE 5, slots 140 are cut in the front section 38*a* of the choke assembly 38. A greater or lesser number than the five illustrated in FIGURE 5 may be provided as desired. A ferrite rod 142 is disposed in each of these slots 140 such that they are parallel to the axis of the source 10 with their ends flush with the outer surface of the front radial wall 130. In addition, the ferrite rods 142 are radially positioned such that they are completely shielded by the outer diameter wall portion 128. That is to say, the rods 142 do not extend into the open interior of the front section 38*a* of the choke assembly 38.

Although it is known in the art to provide a ferrite loaded choke for the purpose of suppressing any radial modes of electromagnetic energy propagation which may arise at higher frequencies, I have found that, by shielding the ferrite rods 142 through the provision of the thick outer diameter wall portion 128, the choke efficiency is substantially enhanced. In order to appreciate the reason for this improvement in choke efficiency a brief investigation of the theory of operation of the plate choke 38 is in order. The rear section 38*b* of the plate choke 38 is dimensioned so as to function as a quarterwave, shorted-end line. Thus the input impedance of the rear choke section 38*b* is that of an open circuit. The front choke section 38*a* is dimensioned to also function as a quarter-wave line which is in series with the rear choke section 38*b*. Thus the front section 38*a* is terminated in an open circuit (the input impedance of the rear section 38*b*) and its input impedance at the face (radial wall 130) of the choke 38 will be a short-circuit as required for efficiency radial choke operation. If, however, the ferrite rods 142 were permitted to extend into the open interior of the front choke section 38*a*, the open-circuit termination of this section is not exactly realized. The rods 142 would in effect detune the plate choke 38 by providing a lossive input impedance to the rear choke section 38*b* and thus a lossive termination for the front choke section 38*a*. This lossive termination reflected to the face of the plate choke 38 will not produce the requisite short-circuit condition. Without this short-circuit condition at the face of the plate choke 38, electromagnetic energy will not be confined in the plate coaxial line 124 and a portion thereof will leak beyond the plate choke 38 thus lowering the operating efficiency of the source 10.

With a short-circuited condition maintained at the face of the choke 38, electromagnetic energy in the TEM mode, the desired propagational mode, will not propagate from the plate coaxial line 124 into the slots 140 formed in the front choke section 38*a*. However, any spurious radial modes of energy will propagate into the slots 140 and will be attenuated by the ferrite rods 142. Were it not for this provision to suppress undesirable propagational modes, the operation of the source 10 would be greatly prejudiced.

Still referring to FIGURE 13, the push rods 40 are connected to the plate choke assembly 38 by screws 143 which pass through the rear radial wall 136 and are threaded into the ends of the push rods 40. These push rods 40 are fixed at their other ends to the tuning drive assembly 32 after passing slidably through axial holes 144 provided in the insulator 36.

Still in connection with FIGURE 13, the cathode choke assembly 56 is a Z-shaped, non-contacting tuning choke having substantially the same cross-sectional configuration as the plate choke assembly 38. The layer 60 of Teflon tape about the outer surface of the cathode choke assembly 56 and the Teflon tape layer 54 about the cathode line 48 maintained the cathode choke assembly 56 in noncontacting relationship with the grid line 34 and the cathode line 48. The cathode choke assembly 56 in combination with the grid line 34 and the cathode line 48 define the physical boundaries for the resonant cathode coaxial line 146. Due to the small ratio dimensions of the cathode choke assembly 56, spurious radial modes of electromagnetic energy propagation are not developed. Accordingly, it is not necessary to provide slots in the front section of the cathode choke assembly 56 or to provide any ferrite loading. In other respects, the theory of operation of the cathode choke 56 is identical to that of the plate choke 38.

Screws 148 project through the rear radial wall of the cathode choke assembly 56 and threadingly engage tapped axial holes in the ends of the push rods 58 which drivingly connect the cathode choke assembly 56 to the tuning drive assembly 32. In so doing, the push rods 58 are slidingly retained in holes 150 provided in insulator 90 as seen in FIGURE 14.

*Tuning drive assembly 32*

Figure 16:
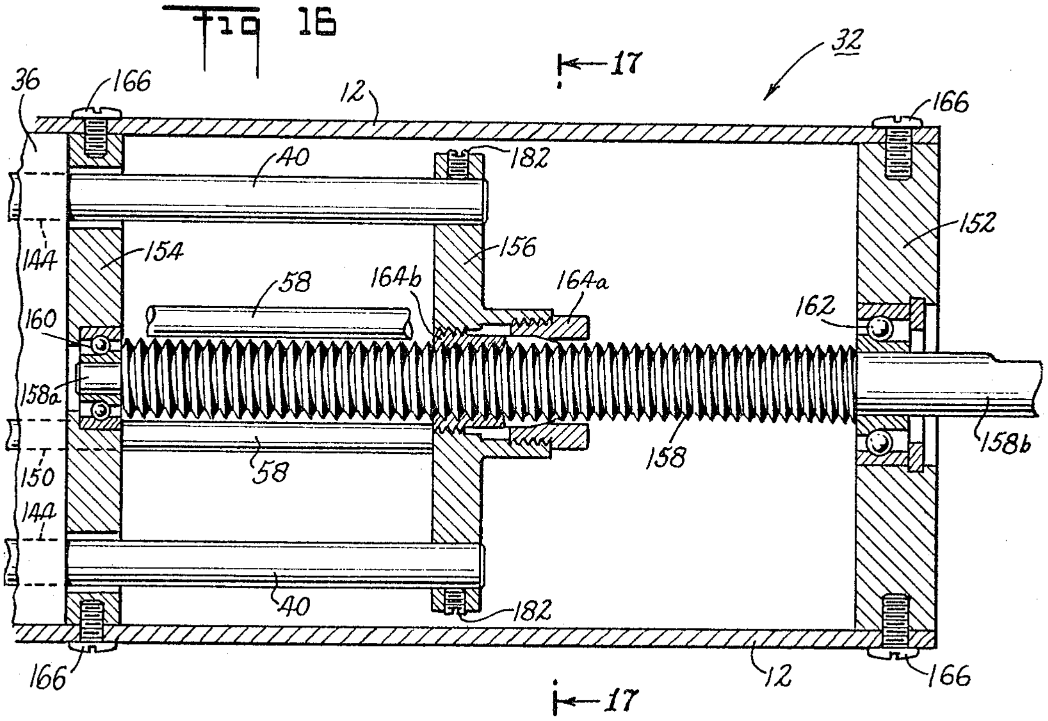
FIGURE 16 is an enlarged sectional top view taken along line 16—16 of FIGURE 10.
Figure 17:
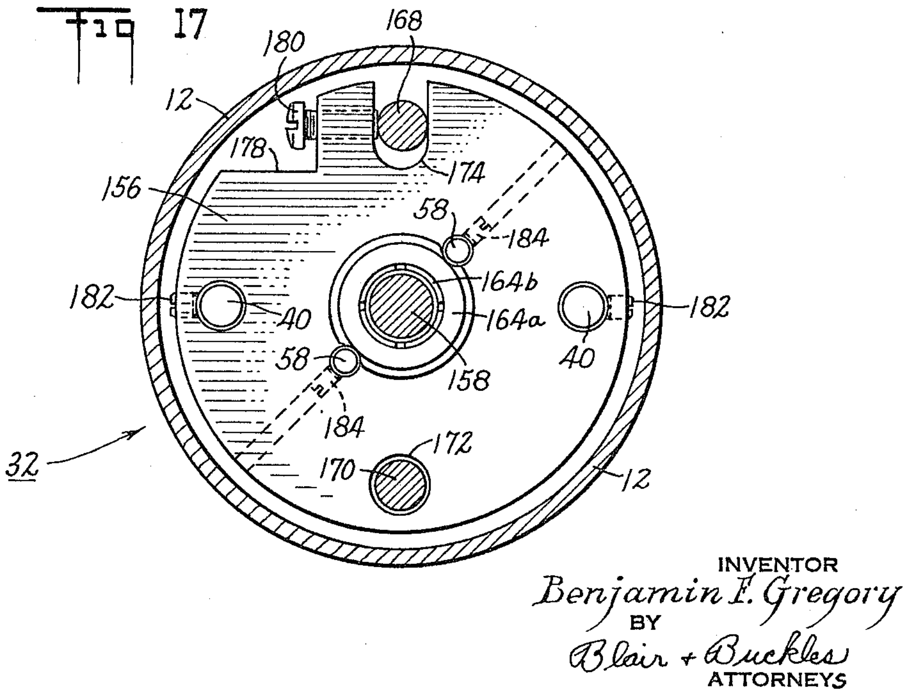
FIGURE 17 is a sectional end elevation view taken along line 17—17 of FIGURE 16.

With specific reference to FIGURES 16 and 17, the tuning drive assembly 32 includes a front end plate 152, a rear end plate 154, and an intermediate tuning drive plate 156. A threaded tuning screw 158 is journaled at its rear end 158*a* in a thrust bearing arrangement 160 centrally disposed in the rear end plate 154. The tuning screw 158 is likewise journaled in a thrust bearing arrangement 162 centrally disposed in the front end plate 152. The end 158*b* of the tuning screw 158 projects through the front end plate 152 to provide convenient external means for rotating the tuning screw.

The drive plate 156 threadingly engages the tuning screw 54 intermediate the front and rear end plates 152 and 154 through the provision of drive nuts 164*a* and 164*b*. The front and rear end plates 152 and 154 are constrained from axial movement by screws 166 which project through the outer shell 12 into threaded engagement therewith and thereby fix their relative axial positions. Thus, since the tuning screw 158 is constrained from axial movement by the fixed end plates 152 and 154 and their respective thrust bearings 162 and 160, rotation of the tuning screw 158 results in axial movement of the drive plate 156.

In order to insure axial movement of the drive plate 156 and to prevent any rotational play therein, guide pins 168 and 170 keyed at their respective ends in end plates 152 and 154, are slidingly received in apertures 172 and 174 in the drive plate 156. To more completely remove any rotational play in the tuning drive assembly 32, the drive plate 156 is relieved at 178 and a set screw 180 of low coefficient friction material projects into the aperture 174. Thus any play between the guide pin 168 and the side walls of the aperture 174 may be readily removed by advancement of the screw 180 into engagement with the guide pin 168. The screw 180 being of low coefficient friction material will place minimum drag on the relative movement of the drive plate 156 with respect to the guide pin 168.

The push rods 40 which are physically coupled to the plate choke assembly 38 are keyed at their ends to the drive plate 156 by set screws 182. The push rods 58 of the cathode choke assembly 56 are also keyed at their ends to the drive plate 152 by set screws 184 shown in FIGURE 17. Thus, it can be seen that by rotational movement of the tuning screw 158, the resulting axial movement of the drive plate 156 is communicated to the choke assemblies 38 and 56 via the push rods 40 and 58 which pass slidingly through rear end plate 154. Thus, by this unique arrangement, the plate choke assembly 38 and the cathode choke assembly 56 are moved in unison through the sole manipulation of the tuning screw 158. It can therefore be said that the plate and cathode choke assemblies 38 and 56 "track" each other in that movement of one results in a corresponding movement of the other. It should be further appreciated that the relative axial positions of the plate and cathode choke assemblies 38 and 56 may be varied by varying the relative axial length of the push rods 40 and 58 between the drive plate 156 and the respective choke assemblies.

*Feedback coupling*

In order to achieve oscillatory operation of the source 10, a portion of the electromagnetic energy oscillating in the plate coaxial line 124 must be coupled back into the cathode coaxial line 146 for application in proper phase and amplitude across the grid 68 and the cathode 70 of the triode 16. In the present invention, this coupling function is primarily performed by the provision of feedback coupling loops 186 shown in FIGURES 4, 6, 10, 12 and 13. With particular reference to FIGURE 13, these coupling loops 186 are formed from electrical conductors bent in the general shape of an S. One loop **186*a* of each of the feedback coupling loops 186 is disposed in the plate coaxial line 124 while the other loop 186*b* is disposed in the cathode coaxial line 146. The mid-portions 186*c* connect loops 186*a* and 186*b* together through holes 188 in the grid line 34. One end of each of the feedback coupling loops 186 is soldered to the end of the grid line 34 while the other ends are soldered to the inner surface of the grid line 34. The midportions 186*c* are maintained out of contact with the grid line 34. As shown in FIGURE 12, six such feedback coupling loops 186 are employed in the present invention. However, a greater or lesser number may be found to give satisfactory operation for the source 10**.

Since the feedback couplings 186 are of the loop type, they should be axially positioned at a point of maximum current in the plate coaxial line 124 to be most effective. The point of maximum current corresponds to a node in the magnetic field of the electromagnetic energy oscillating in plate coaxial line 124. In this position, the feedback coupling loops 186 will provide maximum energy feedback between the plate coaxial line 124 and the cathode coaxial line 146. With the plate and cathode coaxial lines operating in the three-quarter wave mode, the loops 186 should thus be positioned close to the first half, wavelength point from the face of the chokes 38 and 56. The geometry of the feedback coupling loops 186, i.e., the axial displacement of loops **186*a* and 186*b* accounts for the axial displacement of the plate and cathode chokes 38 and 56. That this half wavelength point is a current maximum is appreciated from the fact that a current maximum always occurs at the face of the chokes 38 and 56. In practice the positioning of the feedback coupling loops 186 is compromised to take into account the shifting of this current maximum point as the source 10** is tuned across its frequency band.

In the present invention, it is desired to operate the plate and cathode coaxial lines 124 and 146 in the three-quarter wave operational mode. Ordinarily, triode oscillators inherently prefer to operate in the fundamental or quarter-wave operational mode because the energy losses in this mode are less than in other modes. The desirability of operation in the three-quarter wave mode is occasioned by the fact that the tuning curve characteristics are substantially linear whereas, in the quarter-wave operational mode, the tuning curve characteristics are nonlinear. The tuning curve characteristic refers to the plot of frequency versus the tuning choke axial position or, in other words, turns of the tuning screw 158. This lends predictability and repeatability to the tuning of the source 10.

In order to maintain the plate and cathode coaxial lines 124 and 146 in the three-quarter wave operational mode, the loops **186*a* of the feedback coupling loops 186 are axially positioned such that insufficient energy is coupled back to the cathode coaxial line 146 in the one-quarter wave operational mode to achieve oscillatory signal operation in the source 10. And yet, the loops 186*a* are so positioned to provide sufficient coupling of electromagnetic energy from the plate coaxial line 124 to the grid coaxial line 146** to reinforce operation in the three-quarter wave operational mode.

It has been found that when the source 10 is tuned to the high end of the band, for example 4100 megacycles, by movement of the plate and cathode choke assemblies 38 and 56 to the left as seen in FIGURE 13, the point of maximum current for the electromagnetic energy in the plate coaxial line 124 is likewise shifted to the left. Thus, at the high end of the band, the loop **186*a* of the feedback coupling 196 is no longer positioned sufficiently near a point of maximum current, and as a result, satisfactory energy feedback is not obtained. In order to supplement the feedback function at the high end of the band, additional feedback means in the form of voltage coupling probes 190 are used. In the disclosed embodiment of the invention, two such capacitant probes 190** are shown (FIGURES 4, 6, 10, 12 and 13), although the use of a different number in combination with current coupling loops is considered within the spirit of the invention.

Each of the voltage coupling probes 190, which are shown in FIGURE 13 rotated 90° from their true position shown in FIGURE 10, includes a conductor 192 extending between the plate coaxial line 124 and the cathode coaxial line 146 through the grid line 34. The conductors 192 have conducting disks 194, called hats, affixed to each end thereof to enhance the voltage coupling function of the probes 190. Sleeves 196 of the insulating material serve to insulate the conductors 192 from the grid line 34.

The probes 190 are ideally axially positioned at an electric field node when the plate coaxial line 124 is tuned to the high end of the frequency band. The voltage coupling probes 190 are thus most effective to supplement the coupling loops 186 at the high end of the band in providing sufficient energy feedback between the plate coaxial line 124 and the cathode coaxial line 146 for high frequency operation of the source 10. However, since the plate coaxial line 124 and the cathode coaxial line 146 are axially offset as evident from the relative axial positions of the choke assemblies 38 and 56 and thus, the voltage maximums occurring in the plate and cathode coaxial lines are correspondingly axially displaced, the probes 190 should be axially positioned halfway between these two voltage maximum points.

In addition, the probes 190 should be small in physical size so that they are virtually ineffective at the low end of the frequency band, for example 2000 megacycles. If too large in physical size, the probes 190 would be effective to provide sufficient energy coupling between the plate coaxial line 124 and the cathode coaxial line 146 to cause the source 10 to revert to the fundamental or quarter-wave operational mode.

*Output coupling loop*

Output coupling loop 198, shown in FIGURES 10 and 12, provides for the coupling of electromagnetic energy from the plate coaxial line 124 to the output coaxial connector 14. The output coaxial connector 14 includes an outer conductor 200 and an inner coaxial conductor 202 spaced apart by a dielectric medium 204. The coaxial output connector 14 is mounted in a collar 206 soldered or otherwise affixed in an opening provided in the outer shell 12.

The output coupling loop 198 is mounted at one end in a dielectric plug 208 which, in turn, is affixed in an axial bore provided in the central conductor 202 of the output connector 14. The other end of the output coupling loop 198 is soldered to the end of the outer conductor 200 of the output connector 14 as seen in FIGURE 10. The interposition of the dielectric plug 208 between the end of the coupling loop 198 and the central conductor 202 of the coaxial output connector 14 forms a coaxial capacitor 210. Since, at high frequencies the output coupling loop 198 functions as an inductor which is electrically in series with the coaxial capacitor 210 the output circuit may be tuned to a particular frequency. I have found it advantageous to form the output circuit including loop 198 and capacitor such that it is substantially tuned to the lowest frequency in the frequency band. For a frequency band of 2000 to 4100 megacycles, for example, the output circuit should be tuned to about 2000 megacycles. In this situation, the source 10 is tightly coupled to the output load (not shown) via the output circuit. As a result, the source 10 is maximumly loaded by the particular output load at this frequency. At higher frequencies such as the upper limit, 4100 megacycles, oscillatory operation of the source 10 cannot be sustained under this maximum load condition because of the adverse affect on the amplitude and phase of energy fed back via the loops 186 and the probes 190. The solution is to gradually decrease the loading of the source 10 as it is tuned to higher frequencies. This can be effected by gradually reducing the coupling of the source 10 to the output load as frequency is increased. In practice, this can be achieved by reducing the size of the output coupling loop 198 and/or decreasing the degree of penetration into the plate coaxial line 124. The disadvantages of this practical solution are obvious.

However, by series tuning the output circuit consisting of loop 198 and capacitor 210 at the low end of the frequency band, I obtain an automatic output load decoupling function as the source 10 is tuned to higher frequencies. This, in effect, reduces the output load at higher frequencies and the adverse affect on the energy feedback is largely alleviated.

Since the output coupling loop 198 responds to the magnetic field of the electromagnetic energy in the plate coaxial line 124 in the same manner as the feedback coupling loops 186, the factors considered in the axial positioning of loops 186 apply also in the positioning of the output loop 198. As shown in FIGURE 10, the output coupling loops 198 is positioned in approximate axial alignment with loops **186*a* of the feedback coupling loops 186**.

*Plate by-pass capacitor 83*

As previously described, the insulative layer 82 interposed between the plate terminal member 20 and the end wall 80 of shell 12 forms in combination therewith a plate bypass capacitor 83 for coupling radio frequency energy at the plate ring 66 of triode 16 to the shell 12. At the same time, the layer 82 insulates the D.C. plate circuit from the shell 12.

The plate terminal member 20 as seen in FIGURES 10 and 11 is formed having an annular groove 212. This groove 212 is loaded with ferrite 214 in the form of small chips or pieces prior to the attachment of the plate terminal member 20 to the end wall 80 of shell 12. This ferrite loaded groove 212 functions to frequency tune the bypass capacitor 83. The ferrite 214 in the groove 212 constitutes an inductive reactance making the bypass capacitor 83 less effective at the low end of the frequency band. In other words, the bypass capacitor 83 becomes lossive at the low end of the frequency band but remains fully effective to couple radio frequency energy from the plate 66 of triode 16 to the shell 12 at the high end of the frequency band.

Since the output power of the source 10 is a maximum at the low end of the frequency band and drops off considerably at the upper end, the bypass capacitor 83 serves to substantially flatten the output power versus frequency characteristic of the source. The more ferrite 214 loaded in the groove 212, the greater the flattening effect on the output power characteristic.

It is found also that the ferrite loaded groove 212 in the plate terminal member 20 serves to break up any half-wave propagational modes which tend to be excited when the source 10 is tuned near the upper limits of the frequency band.

*Operation*

In operation of the source 10 shown in FIGURE 1, circuit connection to a positive D.C. supply is made at B+ terminal screw 24, a filament voltage supply is connected to external filament terminal 26, and appropriated biasing voltages are applied to the grid and cathode external terminals 28 and 30. The shell 12 is grounded. The plate supply circuit including plate terminal member 20 is insulated from the shell 12 by insulative layer 82 (FIGURE 10). The grid, cathode, and filament circuits are insulated form the shell 12 by insulators 36, 90 and spacer 50. Thus, with the plate, grid and cathode circuits maintained at appropriate D.C. potentials, oscillatory operation of the triode 16 is achieved.

Both the plate coaxial line 124 and the cathode coaxial line 146 are forced into a three-quarter wave operational mode due to the character and placement of the feedback coupling loops 186 and probes 190. The three-quarter wave mode is the lowest ordered operational mode to provide sufficient feedback energy to sustain oscillation. The plate and cathode chokes 38 and 56 which tune their respective coaxial lines 124 and 146, more in unison under control of the tuning drive assembly 32, i.e., "track" one another, and thus also function to prevent either coaxial line 124 or 146 from reverting to the fundamental or quarter-wave operational mode.

The ferrite loading of the plate choke suppress any radial modes of propagation which are excited as the source is tuned to higher frequencies, and since the ferrite loading is completely shielded, choke efficiency is preserved.

The output coupling loop 198 is employed to extract usable high frequency electrical energy from the plate coaxial line 124 of source 10 and, via output connector 14, supply an output load. The provision of the series connected coaxial capacitor 210 in combination with output coupling loop 198 provides an output load decoupling function necessary to sustain the appropriate character of the feedback energy as the source 10 is tuned to the upper frequency limits of the frequency band.

The ferrite loaded groove 212 in the plate terminal member 20 not only shapes or flattens the output power versus frequency characteristic but, in addition, functions to break up any half-wave propagational modes which might otherwise adversely affect the operation of the source 10 at the higher frequency limits.

It will thus be seen that the objects set forth above, among those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described my invention, what I claim as new and desire to secure by Letters Patent is:

1. A microwave oscillator comprising, in combination,
(A) a high frequency triode having plate, grid and cathode terminals,
(B) a tubular conductive outer shell
(C) a by-pass capacitor for electrically coupling said plate terminal to said shell, said bypass capacitor comprising
  (1) as one plate thereof, a terminal member in electrical contacting engagement with said plate terminal of said triode, said member having
    (a) an annular groove formed in a surface thereof, and
    (b) an attenuating material disposed in said groove
  (2) a dielectric medium interposed between said surface of said terminal member and a portion of said shell constituting the other plate of said bypass capacitor,
  (3) whereby said bypass capacitor is lossive at the low end of the frequency band
(D) a tubular conductive cathode line member coaxially disposed within said shell and electrically connected to said cathode terminal,
(E) a tubular conductive grid line member coaxially disposed intermediate said shell and said cathode line member,
(F) a first annular tuning choke slidingly disposed between said outer shell and said grid line member to define a plate coaxial line,
(G) output circuit means for coupling said plate coaxial line to an output load.

2. The device claimed in claim 1 wherein said output circuit means includes
(1) a conductive loop disposed in said plate coaxial line for coupling electromagnetic energy in said plate line to an output load,
(2) a capacitor in circuit connection with said conductive loop,
(3) said conductive loop and said capacitor being tuned to series resonance at the lower end of the frequency band whereby on increase in frequency, the output load is partially decoupled from said plate coaxial line.

3. The device claimed in claim 2 which further includes
(H) a second annular tuning choke slidingly disposed between said grid line member and said cathode line member and defining therewith, a cathode coaxial line, and
(I) tuning drive means operably connected to said first and second tuning chokes for varying the axial positions thereof, said drive means including
  (1) a pair of end plates,
  (2) a tuning screw journaled in said end plates and constrained from axial movement,
  (3) a drive plate threadingly engaging said tuning screw and axially movable between said end plates upon rotation of said tuning screw,
  (4) push rods operatively connecting said drive plate to said first and second tuning chokes such that axial movement of said drive plate causes corresponding axial movement of each of said tuning chokes, and
  (5) guide pins extending between said end plates and slidingly received in apertures in said drive plate such as to prevent rotational movement of said drive plate.

References Cited by the Examiner

UNITED STATES PATENTS

| | | | |
|---|---|---|---|
| 2,428,622 | 10/1947 | Guprewitsch | 331—98 |
| 2,472,204 | 6/1949 | Fubini et al. | 331—98 |
| 2,525,452 | 10/1950 | Gurewitsch | 331—98 X |
| 2,577,971 | 12/1951 | Law | 331—97 |
| 2,607,898 | 8/1952 | Nelson | 333—82 X |
| 2,646,511 | 7/1953 | Hulstede | 331—101 |
| 2,659,025 | 11/1953 | Huggins | 331—101 X |
| 2,692,977 | 10/1954 | Koppel | 333—83 |
| 2,710,945 | 6/1955 | Edson | 333—83 |
| 2,712,071 | 6/1955 | Johnson | 331—101 X |
| 2,795,669 | 6/1957 | Balash et al. | 334—42 |
| 2,907,962 | 10/1959 | Jaffe | 333—82 |

FOREIGN PATENTS 597,923 2/1948 Great Britain.

ROY LAKE, *Primary Examiner.*

J. B. MULLINS, *Assistant Examiner.*